(12) United States Patent
Matsuda et al.

(10) Patent No.: US 7,335,315 B2
(45) Date of Patent: Feb. 26, 2008

(54) METHOD AND DEVICE FOR MEASURING WAFER POTENTIAL OR TEMPERATURE

(75) Inventors: Ryuichi Matsuda, Takasago (JP);
Yuichi Kawano, Takasago (JP);
Masahiko Inoue, Kobe (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 92 days.

(21) Appl. No.: 10/513,396

(22) PCT Filed: Jun. 17, 2003

(86) PCT No.: PCT/JP03/07649

§ 371 (c)(1),
(2), (4) Date: Nov. 4, 2004

(87) PCT Pub. No.: WO03/107415

PCT Pub. Date: Dec. 24, 2003

(65) Prior Publication Data

US 2005/0174135 A1    Aug. 11, 2005

(30) Foreign Application Priority Data

Jun. 17, 2002    (JP) .............................. 2002-175247
Jun. 25, 2002    (JP) .............................. 2002-184160

(51) Int. Cl.
*G01L 21/30* (2006.01)

(52) U.S. Cl. .............................. 216/60; 216/67; 438/7; 438/16; 438/714; 427/569

(58) Field of Classification Search .................. 216/59, 216/60, 67; 118/724, 725; 438/5, 7, 14, 438/16, 714; 156/345.24, 345.27, 345.28, 156/345.43; 427/569
See application file for complete search history.

(56) References Cited

U.S. PATENT DOCUMENTS

| 6,084,763 | A  | * | 7/2000 | Hirano et al. ................. 361/234 |
| 6,198,616 | B1 | * | 3/2001 | Dahimene et al. .......... 361/234 |
| 6,252,758 | B1 | * | 6/2001 | Nagao et al. ................ 361/234 |
| 6,320,737 | B1 | * | 11/2001 | Hirano et al. ................ 361/234 |
| 6,778,377 | B2 | * | 8/2004 | Hagi .......................... 361/234 |
| 6,975,497 | B2 | * | 12/2005 | Nagao et al. ................ 361/234 |
| 2004/0188021 | A1 | * | 9/2004 | Mitrovic ................. 156/345.52 |

FOREIGN PATENT DOCUMENTS

| JP | 06-151568 | * | 5/1994 |
| JP | 2000-332075 | | 11/2000 |
| WO | 99/52144 | | 10/1999 |

* cited by examiner

*Primary Examiner*—George A. Goudreau
(74) *Attorney, Agent, or Firm*—Wenderoth, Lind & Ponack, L.L.P.

(57) ABSTRACT

The present invention attracts a wafer 6, placed on a susceptor 5, toward the susceptor 5 by the electrostatic attractive power of an electrostatic chuck electrode 7, varies the output voltage of a variable direct current power source 23 for the electrostatic chuck electrode 7 while measuring the temperature of the wafer 6 by a temperature detection sensor 21; and detects the potential of the wafer 6 based on the output voltage of the variable direct current power source 23 at a time when the temperature of the wafer 6 peaks.

3 Claims, 7 Drawing Sheets

METHOD AND DEVICE FOR MEASURING WAFER POTENTIAL OR TEMPERATURE

TECHNICAL FIELD

This invention relates to a wafer potential or temperature measuring method and apparatus.

BACKGROUND ART

FIG. 7 is a configurational drawing of a plasma CVD system according to a conventional technology. As shown in the drawing, a chamber 2, which is a cylindrical vacuum container made of aluminum, is provided on a base 1, and a film deposition room 3 is defined within the chamber 2. A disk-shaped ceiling board 4, which is an electromagnetic wave transmission window, is provided above the film deposition room 3. A susceptor 5, which is a support stand for a wafer 6, is disposed within the film deposition room 3. The susceptor 5 is a disk-shaped member for bearing the wafer 6, is composed of a ceramic material such as $Al_2O_3$ or AlN, and is supported by a support shaft 8. A heater 6a, which is a heating means for keeping the wafer 6 at a predetermined temperature, and a coolant passage 6b for allowing a coolant as cooling means to pass therethrough are buried within the susceptor 5. An electrostatic chuck electrode 7 for an electrostatic chuck, which electrostatically attracts and holds the wafer 6, is also buried within the susceptor 5. A predetermined direct current voltage, which is an output voltage from a direct current power source 13, is applied to the electrostatic chuck electrode 7 via a low pass filter 12. Coulomb force based on a potential difference between the wafer 6 and the electrostatic chuck electrode 7, which occurs because of the application of the DC voltage, results in the attraction of the wafer 6 to the surface of the susceptor 5.

A bias high frequency power source 11 is connected to the electrostatic chuck electrode 7 in the plasma CVD system via a matching instrument 10 for performing impedance matching and a capacitor 9. That is, the electrostatic chuck electrode 7 also functions as a bias electrode. The aforementioned LPF 12 functions as a filter for cutting off an alternating current portion of the bias high frequency power source 11.

As described above, a bias voltage is applied to the wafer 6 via the electrostatic chuck electrode 7 by supplying a high frequency power from the bias high frequency power source 11. The bias voltage is a so-called RF bias. A direct current negative voltage, generated by application of the RF bias, accelerates ions in a plasma to strike the face of the wafer 6 exposed to a plasma atmosphere, whereby various effects, such as promotion of a surface reaction, anisotropic etching, and improvement in film quality, can be obtained.

An exhaust port 15 is provided in the base 1, and gases within the film deposition room 3 are discharged to a vacuum pumping system (not shown) via the exhaust port 15 to bring the interior of the film deposition room 3 to a low pressure environment. Various gases for performing film deposition are supplied to the interior of the film deposition room 3 in this low pressure environment via nozzles (not shown). To form a film of silicon nitride (SiN) on the wafer 6, for example, $SiH_4$, for example, is supplied as a source gas, and $NH_3$ or $N_2$, for example, is supplied as a nitriding gas.

A power supply antenna 16 in a spiral form is mounted on the upper surface of the ceiling board 4. A plasma generation high frequency power source 18 is connected to the power supply antenna 16 via a matching instrument 17 for performing impedance matching. High frequency power is supplied from the plasma generation high frequency power source 18 to the power supply antenna 16, whereby electromagnetic waves 19 are thrown from the power supply antenna 16 into the film deposition room 3 through the ceiling board 4. Various gases supplied into the film deposition room 3 are converted to a plasma state by the energy (high frequency power) of the electromagnetic waves 19. This plasma is utilized to carry out processing, such as deposition of a predetermined metal film on the wafer 6.

In the above-described plasma CVD system, in order to ensure the predetermined performance of the plasma CVD system under constant plasma conditions, defined by the types, pressures and flow rates of the gases for plasma formation, and the power (electric power) supplied to the power supply antenna 16, it is necessary to measure the potential of the wafer 6 under predetermined plasma conditions. If, under these plasma conditions, the potential of the wafer 6 is a constant potential, it can be ensured that the quality, etc. of the outcome of plasma processing, such as a deposited film, is constant; namely, reproducibility can be ensured.

However, it is difficult to measure the potential of the wafer 6 during plasma processing without causing a problem. The potential can be measured easily if a probe of a measuring device can be brought into contact with the wafer 6. However, the contact of the probe results in metal contamination of the wafer 6, deteriorating the characteristics of the wafer 6 as a product. That is, to measure the potential of the wafer 6 during plasma processing without any problem, measurement needs to be made in a noncontact manner.

The present invention has been accomplished in the light of the above-described earlier technology. It is an object of the invention to provide a wafer potential measuring method and apparatus, which can measure the potential of a wafer in a noncontact manner, i.e., without contact of a probe or the like with the wafer, and a plasma processing system having the wafer potential measuring apparatus.

In the above plasma CVD system, moreover, it may be desired to control the temperature of the wafer 6. During a burying process for burying a predetermined metal in a very thin trench, for example, a high efficiency is obtained if the burying is performed in an atmosphere where an etching action by ions of the metal is predominant. Thus, the wafer is desired to be kept at a predetermined high temperature. To avoid damage due to strikes of metal ions against an element already formed on the wafer 6, on the other hand, the burying needs to be performed in an atmosphere where an etching action by the metal ions is suppressed. Thus, the wafer is desired to be kept at a predetermined low temperature.

In short, even when plasma conditions, defined by the types, pressures and flow rates of the gases for plasma formation, and the power (electric power) supplied to the power supply antenna 16, are set to be constant, the outcome of plasma processing, such as the quality of a deposited film, is different, depending on the temperature of the wafer 6. Thus, the temperature of the wafer 6 needs to be managed in order to ensure the reproducibility of plasma processing.

Nevertheless, an appropriate method for detection of the wafer temperature, which can exercise temperature control conveniently and precisely, has not been existent.

In view of the aforementioned earlier technology, the present invention has, as another object, the provision of a wafer temperature detecting method and apparatus capable of exercising the temperature control of a wafer conveniently and precisely.

DISCLOSURE OF THE INVENTION

The present invention, which attains the above objects, is based on the following findings:

An electrostatic chuck, as stated earlier, attracts the wafer 6 to the surface of the susceptor 5 by Coulomb force based on the potential difference between the wafer 6 and the electrostatic chuck electrode 7 that is generated upon application of a predetermined direct current voltage, which is the output voltage of the direct current power source 13, to the electrostatic chuck electrode 7. Thus, if it can be detected by separate means that the attractive power of the electrostatic chuck electrode 7 has fallen to zero, in other words, the potential difference between the wafer 6 and the electrostatic chuck electrode 7 has fallen to zero, the potential of the electrostatic chuck electrode 7 at this time can be regarded as the potential of the wafer 6. The fact that the attractive power has fallen to zero can be detected by monitoring the temperature of the wafer 6. This is because the greater the attractive power, the more strongly the wafer 6 is attracted to the surface of the susceptor 5, and the better the wafer 6 is cooled with the coolant flowing through the coolant passage 6b. Accordingly, the temperature is assumed to be the highest at a time when the attractive power is zero.

Under these circumstances, as the output voltage of the direct current power source 13 was varied in the plasma CVD system shown in FIG. 7, the relation between the output voltage and the temperature of the wafer 6 was measured. The results are shown in FIG. 1. The drawing showed that, as expected, the temperature characteristics formed an upwardly convex curve, which showed a peak temperature of about 600° C., and an output voltage of −250 (V) on this occasion. This value of −250 (V) is the potential of the wafer 6. At this time, the output power of the plasma generation high frequency power source 18 is 3.5 (kW), while the output power of the bias high frequency power source 11 is 1.2 (kW).

The features of the invention concerned with a wafer potential measuring method based on such findings are as follows:

1) A wafer potential measuring method, characterized by: attracting a wafer, placed on a base stand, toward the base stand by an electrostatic attractive power generated by application of the output voltage of a direct current power source; varying the output voltage of the direct current power source while measuring the temperature of the wafer in an attracted state; and detecting the potential of the wafer based on the output voltage of the direct current power source at a time when the temperature of the wafer peaks.

As a result, the potential of the wafer can be detected, without contact with the wafer, through the intermediary of the temperature of the wafer. That is, the fact that the electrostatic attractive power on the wafer has fallen to zero, in other words, the potential of the base stand and that of the wafer have become identical, can be detected by utilization of the peak temperature of the wafer.

Upon detection of the wafer potential, the performance of each system can be easily evaluated and ensured based on the wafer potential of that system under the same plasma conditions. For example, the fact that there are no variations in the wafer potential characteristics in each system and the potential in easy system is identical can ensure the quality and reproducibility of a product produced by each system.

Furthermore, once the potential of the wafer is known, the amount of ions (the amount of current) is known for the following reason: If the potential of the wafer can be measured, the product of the voltage, which is based on this potential, and the current is the electric power supplied, and the value of the supplied electric power is known. The amount of ions varies according to plasma conditions whose parameters are the flow rates, pressures, types, etc. of gases forming the plasma. Rational setting of the plasma conditions mediated by the amount of ions is also facilitated. Conventionally, the optimal plasma conditions have been sought by trial and error.

2) A wafer potential measuring method, characterized by: attracting a wafer, placed on a base stand, toward the base stand by an electrostatic attractive power of an electrostatic chuck; varying the output voltage of a direct current power source for the electrostatic chuck while measuring the temperature of the wafer in an attracted state; and detecting the potential of the wafer based on the output voltage of the direct current power source at a time when the temperature of the wafer peaks.

Thus, in addition to the same actions and effects as those of the invention described in 1), there is also the advantage that these actions and effects can be obtained by utilizing the electrostatic chuck, the existing equipment, at a lower cost.

3) A wafer potential measuring method, characterized by: accelerating ions near a wafer, placed on a base stand, by application of an RF bias; superimposing the output voltage of a direct current power source on the RF bias voltage in an ion-accelerated state; attracting the wafer, placed on the base stand, toward the base stand by an electrostatic attractive power generated by application of the output voltage of the direct current power source; varying the output voltage of the direct current power source while measuring the temperature of the wafer in an attracted state; and detecting the potential of the wafer based on the output voltage of the direct current power source at a time when the temperature of the wafer peaks.

Thus, in addition to the same actions and effects as those of the invention described in 1), there is also the advantage that the value of the bias voltage can be managed rationally and easily through the intermediary of the wafer potential. Conventionally, management of the bias voltage value by an RF bias voltage has relied greatly on experience.

The features of the inventions concerned with a wafer potential measuring apparatus, and a plasma processing system including this apparatus are as follows:

4) A wafer potential measuring apparatus, comprising: a variable direct current power source adapted to apply a direct current output voltage for attracting a wafer, placed on a base stand, toward the base stand by an electrostatic attractive power, and to be capable of varying the output voltage; and temperature detecting means for detecting the temperature of the wafer.

As a result, the potential of the wafer can be detected, without contact with the wafer, through the intermediary of the temperature of the wafer.

Upon detection of the wafer potential in the above manner, the performance of each system can be easily evaluated and ensured based on the wafer potential of that system under the same plasma conditions. For example, the fact that there are no variations in the wafer potential characteristics in each system and the potential in easy system is identical can ensure the quality and reproducibility of the product produced by each system.

Furthermore, once the potential of the wafer is known, the amount of ions (the amount of current) is known. This is because if the potential of the wafer can be measured, the product of the voltage, which is based on this potential, and the current is the electric power supplied, and the value of the supplied electric power is known. The amount of ions varies according to plasma conditions whose parameters are the flow rates, pressures, types, etc. of gases forming the plasma. Rational setting of the plasma conditions mediated by the amount of ions is also facilitated.

5) In the apparatus described in 4), the variable direct current power source can be adapted to be capable of varying the output voltage of the direct current power source for an electrostatic chuck.

Thus, in addition to the same actions and effects as those of the invention described in 4), there is also the advantage that these actions and effects can be obtained at a lower cost by utilizing the electrostatic chuck, the existing equipment.

6) A wafer potential measuring apparatus, comprising: an RF bias power source for accelerating ions near a wafer placed on a base stand; a variable direct current power source adapted to apply a direct current output voltage for attracting the wafer, placed on the base stand, toward the base stand by an electrostatic attractive power while superimposing the direct current output voltage on an output of the RF bias power source, and to be capable of varying the direct current output voltage; and temperature detecting means for detecting the temperature of the wafer.

Thus, in addition to the same actions and effects as those of the invention described in 5), there is also the advantage that the value of the bias voltage can be managed rationally and easily through the intermediary of the wafer potential. Conventionally, management of the bias voltage value by an RF bias voltage has relied greatly on experience.

7) The wafer potential measuring apparatus described in any one of 4) to 6), the temperature detecting means is noncontact temperature detecting means, such as an infrared temperature gauge, for detecting the temperature of the wafer in a noncontact manner.

Thus, in addition to the same actions and effects as those of the invention described in 1), there is the advantage that the temperature of the wafer can be measured most satisfactorily without posing a problem such as metal contamination.

8) A plasma processing system, such as a plasma CVD system, in which a wafer is placed on a base stand disposed within a chamber, and a plasma within the chamber is used to perform predetermined processing of the wafer, can include the wafer potential measuring apparatus described in any one of 5) to 7).

Thus, a plasma CVD system having the actions and effects described in 4) to 7) can be constituted, and its performance ensuring, etc. can be performed easily and objectively.

The features of the invention concerned with a wafer temperature detecting method based on the aforementioned findings are as follows:

9) A wafer temperature detecting method is characterized by attracting a wafer, placed on a base stand, toward the base stand by an electrostatic attractive power generated by application of a direct current voltage; varying the direct current voltage while measuring the temperature of the wafer in an attracted state; and detecting the temperature of the wafer in response to each direct current voltage to obtain temperature characteristics of the wafer beforehand; detecting the direct current voltage; and checking the value of the voltage and the temperature characteristics against each other, thereby detecting the temperature of the wafer.

As a result, the temperature of the wafer can be detected easily and highly accurately, without contact with the wafer, through the intermediary of the voltage for chucking of the wafer. Thus, temperature control of the wafer can be performed easily.

10) A wafer temperature detecting method is characterized by accelerating ions near a wafer, placed on a base stand, by application of an RF bias; superimposing a direct current voltage on the RF bias in an ion-accelerated state; attracting the wafer, placed on the base stand, toward the base stand by an electrostatic attractive power generated by application of the direct current voltage; varying the direct current voltage while measuring the temperature of the wafer in an attracted state; and detecting the temperature of the wafer in response to each direct current voltage to obtain temperature characteristics of the wafer beforehand; and detecting the output voltage of the direct current power source; and checking the value of the voltage and the temperature characteristics against each other, thereby detecting the temperature of the wafer.

As a result, the same actions and effects as those of the invention described in 9) are obtained when accelerating ions near a wafer, placed on a base stand, by application of an RF bias; also superimposing a direct current voltage on the RF bias; and attracting the wafer, placed on the base stand, toward the base stand by an electrostatic attractive power generated by application of the direct current voltage.

11) The wafer temperature detecting method described in 9) or 10) can be further characterized by preparing a plurality of base stands, each of the base stands having projections in contact with the back of the wafer, and the base stands having different areas of contact with the wafer via the projections; obtaining a plurality of temperature characteristics of the wafer with different dynamic ranges because of different areas of contact between each of the base stands and the wafer via the projections of each of the base stands; and selecting any one of the temperature characteristics to detect the temperature of the wafer under conditions identical with conditions for obtaining the selected temperature characteristic.

As a result, a plurality of temperature characteristics in different dynamic ranges can be obtained. By selecting optimal temperature characteristics taking the operating temperature region of the system into consideration, the detection accuracy of the wafer temperature can be further increased.

12) The wafer temperature detecting method described in 9) or 10), characterized by preparing a plurality of base stands, each of the base stands having projections in contact with the back of the wafer, and the base stands having different distances from the wafer via the projections; obtaining a plurality of temperature characteristics of the wafer with different dynamic ranges because of different distances between each of the base stands and the wafer via the projections of each of the base stands; and selecting any one of the temperature characteristics to detect the temperature of the wafer under conditions identical with conditions for obtaining the selected temperature characteristic.

As a result, a plurality of temperature characteristics in different dynamic ranges can be obtained. By selecting optimal temperature characteristics taking the operating temperature region of the system into consideration, the detection accuracy of the wafer temperature can be further increased.

13) The wafer temperature detecting method described in 9) or 10) can be characterized by preparing a plurality of base stands composed of different materials; obtaining temperature characteristics of the wafer with different dynamic ranges; and selecting any one of the temperature characteristics to detect the temperature of the wafer under conditions identical with conditions for obtaining the selected temperature characteristic.

As a result, a plurality of temperature characteristics in different dynamic ranges can be obtained. By selecting optimal temperature characteristics, taking the operating temperature region of the system into consideration, the detection accuracy of the wafer temperature can be further increased.

The inventions concerned with a wafer temperature detecting apparatus, and a plasma processing system including this apparatus, are as follows:

14) A wafer temperature detecting apparatus is characterized by temperature characteristic storage means for storing temperature characteristics which are obtained by attracting a wafer, placed on a base stand, toward the base stand under an electrostatic attractive power generated by application of an output voltage of a direct current power source; varying the output voltage of the direct current power source while measuring the temperature of the wafer in an attracted state; and detecting the temperature of the wafer in response to each output voltage. A variable direct current power source is the direct current power source capable of varying in the output voltage and voltage detecting means for detecting the output voltage of the variable direct current power source. A voltage signal representing the output voltage of the variable direct current power source, which is an output signal of the voltage detecting means, is inputted into the temperature characteristic storage means, where the voltage signal and the temperature characteristics are checked against each other to determine the temperature of the wafer, and a temperature signal representing the temperature is outputted.

As a result, the temperature of the wafer can be detected easily and highly accurately, without contact with the wafer, through the intermediary of the voltage for chucking of the wafer. Thus, temperature control of the wafer can be performed easily. When plasma processing, such as film deposition, is completed and the wafer is carried out of the system by transport means, cooling of the wafer to a predetermined temperature is desirable in order to decrease the heat load of a transport device. In such a case, control can be exercised, through the intermediary of the voltage for chucking of the wafer, such that the wafer is cooled to the predetermined temperature.

15) A wafer temperature detecting apparatus can be characterized by temperature characteristic storage means for storing temperature characteristics which are obtained by attracting a wafer, placed on a base stand, toward the base stand under an electrostatic attractive power generated by application of the output voltage of a direct current power source. The output voltage of the direct current power source is varied while measuring the temperature of the wafer in an attracted state and the temperature of the wafer is detected in response to each output voltage. A variable direct current power source is the direct current power source capable of varying in the output voltage. A voltage detecting means detects the output voltage of the variable direct current power source and an RF bias power source for applying an RF bias for accelerating ions near the wafer placed on the base stand. The direct current voltage for attracting the wafer, placed on the base stand, toward the base stand under the electrostatic attractive power is applied while being superimposed on the RF bias. A voltage signal representing the output voltage of the variable direct current power source, which is an output signal of the voltage detecting means, is inputted into the temperature characteristic storage means. The voltage signal and the temperature characteristics are checked against each other to determine the temperature of the wafer and a temperature signal representing the temperature is outputted.

As a result, the same actions and effects as those of the invention described in 14) are obtained when accelerating ions near a wafer, placed on a base stand, by application of an RF bias; also superimposing a direct current voltage on the RF bias; and attracting the wafer, placed on the base stand, toward the base stand by an electrostatic attractive power generated by application of the direct current voltage.

16) The wafer temperature detecting apparatus described in 14) or 15) can be further characterized in that the temperature characteristic storage means stores a plurality of temperature characteristics with different dynamic ranges; selects any of the temperature characteristics; and outputs the temperature signal representing the temperature of the wafer determined based on the selected temperature characteristic under conditions identical with conditions for obtaining the selected temperature characteristic.

As a result, a plurality of temperature characteristics in different dynamic ranges can be obtained. By selecting optimal temperature characteristics taking the operating temperature region of the system into consideration, the detection accuracy of the wafer temperature can be further increased.

17) A plasma processing system, such as a plasma CVD system, in which a wafer is placed on a base stand disposed within a chamber and a plasma within the chamber is used to perform predetermined processing of the wafer, can be characterized by including the wafer temperature detecting apparatus described in any one of feature 6 to 8.

Thus, the effects of the invention described in 14) to 16) can be obtained in the plasma CVD system, and various modes of control of the wafer temperature in the plasma CVD system become easy. 18) The plasma processing system described in 17) can be further characterized in that the wafer temperature detecting apparatus includes control means which stores the control value of the wafer temperature corresponding to predetermined conditions, and controls the output voltage of the variable power source such that the potential of the wafer is a potential corresponding to the control value.

Thus, controlling to the wafer temperature conditions set in the plasma CVD system can be automatically performed, and plasma processing with high reproducibility can be performed under these temperature conditions.

BEST MODE FOR CARRYING OUT THE INVENTION

Embodiments of the present invention will now be described in detail based on the accompanying drawings.

First Embodiment

Figure 2:
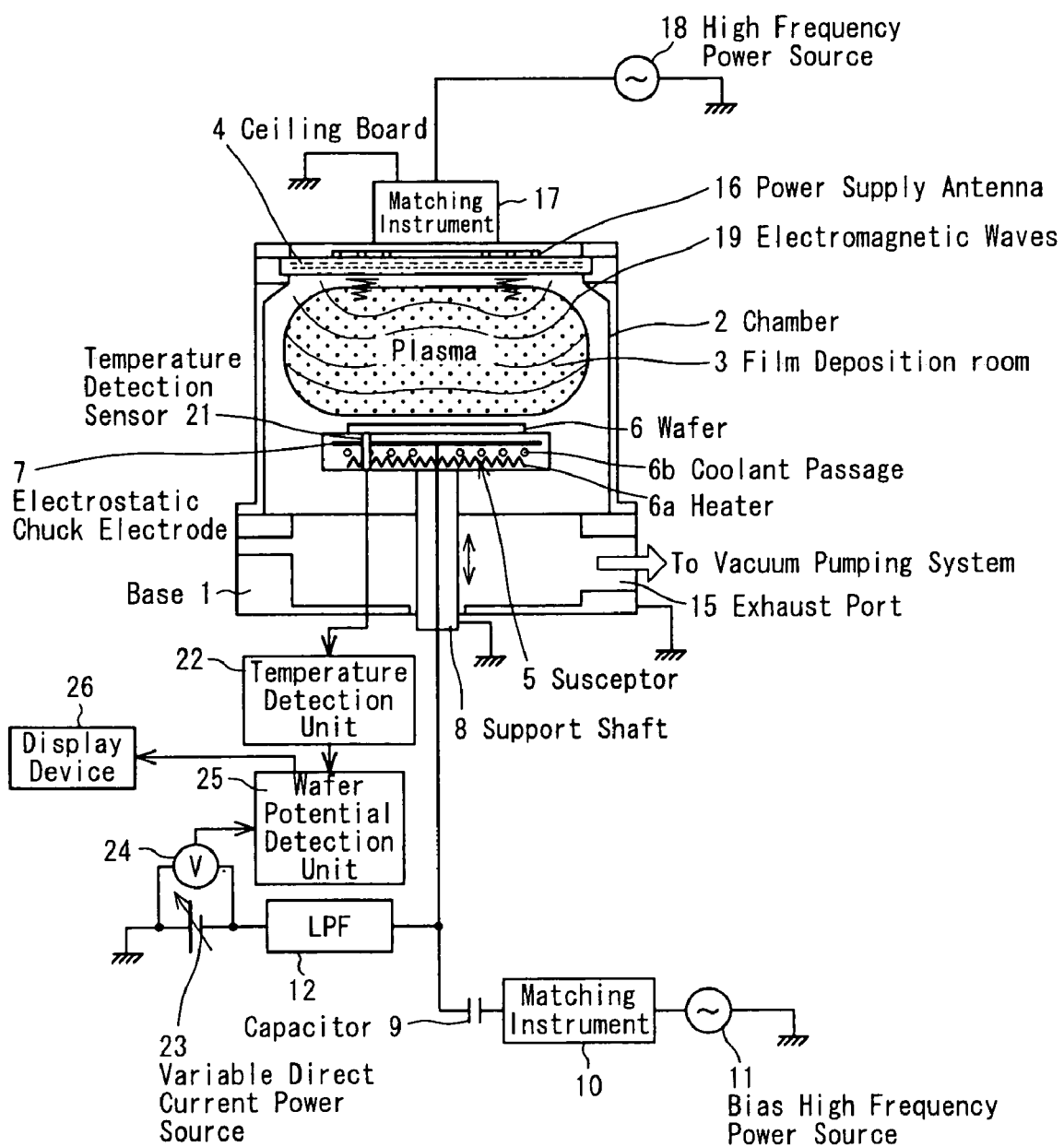
FIG. 2 is a configurational drawing showing a plasma CVD system incorporating a wafer potential measuring apparatus according to a first embodiment of the present invention.
Figure 7:
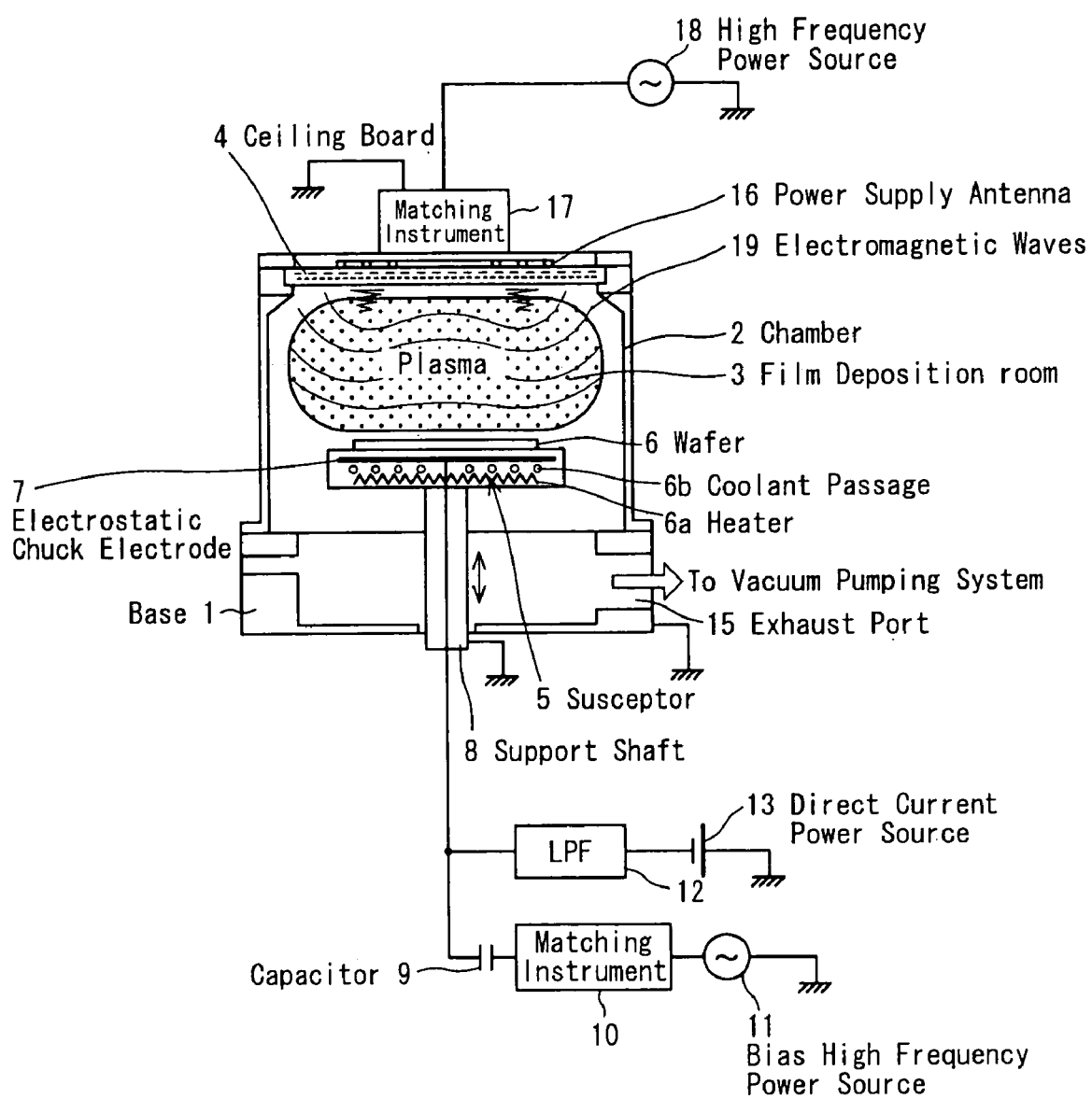
FIG. 7 is a configurational drawing showing the plasma CVD system according to the earlier technology.

FIG. 2 is a configurational drawing showing a plasma CVD system incorporating a wafer potential measuring apparatus according to the first embodiment of the present invention. The plasma CVD system shown in the drawing is not essentially different from the plasma CVD system shown in FIG. 7, except that the wafer potential measuring apparatus is incorporated. In FIG. 2, therefore, the same portions as in FIG. 7 are assigned the same numerals, and duplicate explanations are omitted.

Figure 1:
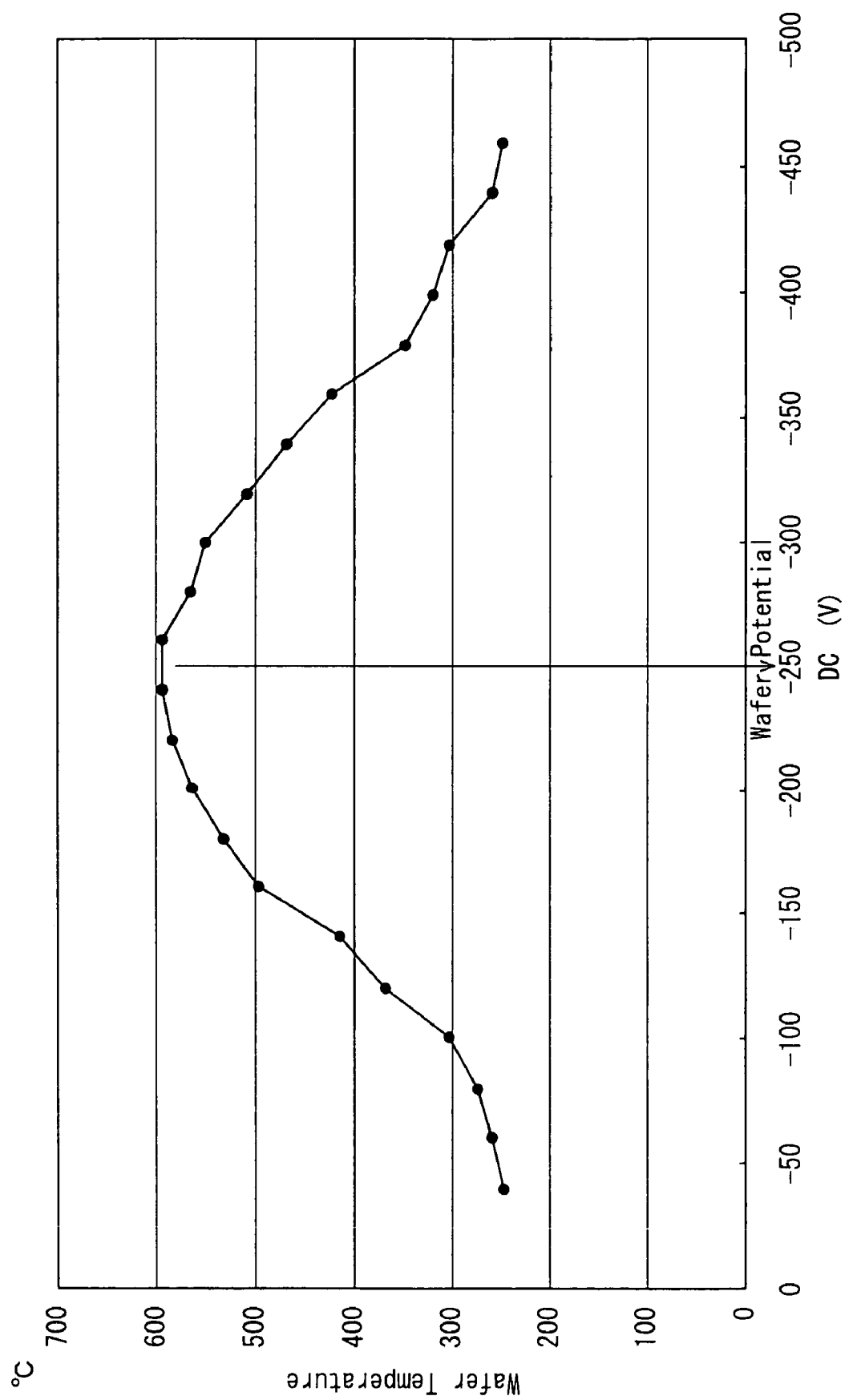
FIG. 1 is a characteristic view showing temperature characteristics obtained by measuring the temperature of a wafer in response to changes in the output voltage of a direct current power source in the plasma CVD system shown in FIG. 7.

As shown in FIG. 2, the wafer potential measuring apparatus is composed of a temperature detection sensor 21, a temperature detection unit 22, a variable direct current power source 23, a voltmeter 24, a wafer potential detection unit 25, and a display device 26. The temperature detection sensor 21 can be preferably formed from an optical fiber piercing through the susceptor 5 in the following manner: A front end portion of the optical fiber is passed through the susceptor 5 to face the back of the wafer 6, an optical signal representing the status of the back of the wafer 6 is obtained in a noncontact manner, and the optical signal is guided to the outside. The optical signal guided outward by the optical fiber is led to the temperature detection unit 22, which is formed from an infrared temperature gauge or the like, where the optical signal is converted into a temperature signal, an electrical signal representing the temperature of the wafer 6. The voltmeter 24 detects the output voltage of the variable direct current power source 23, issuing a voltage signal representing this output voltage. The wafer potential detection unit 25 processes the temperature signal and the voltage signal in association with each other to prepare a graph of temperature characteristics corresponding substantially to FIG. 1, thereby detecting the value of the output voltage of the variable direct current power source 23 corresponding to the peak temperature of the wafer 6. This voltage value is sent to the display device 26 as a wafer potential signal representing the wafer potential. The display unit 26 displays the wafer potential based on the wafer potential signal. The output voltage of the variable direct current power source 23 can be manually changed, as desired, by an operator in charge of measurement, but can also be changed automatically by a predetermined procedure. In this case, a region in the vicinity of the peak temperature is detected by initial measurement, and then the output voltage is elaborately changed within this region, whereby the output voltage corresponding accurately to the peak temperature, namely, the wafer potential, can be detected.

Figure 3:
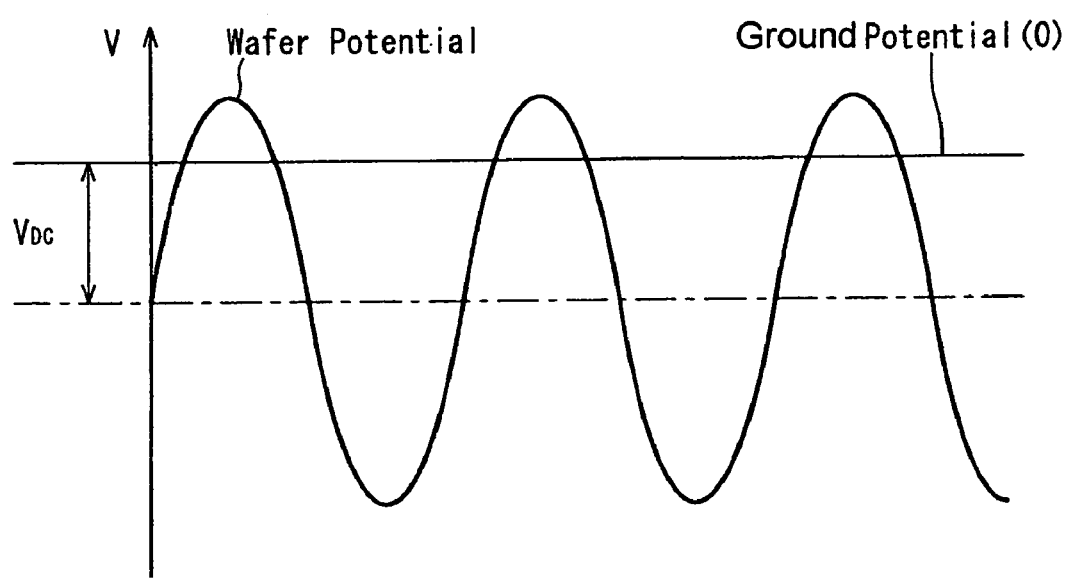
FIG. 3 is a graph showing the characteristics of wafer potential in the system shown in FIG. 2.

According to the present embodiment mentioned above, the potential of the wafer 6 can be detected in a noncontact manner through the intermediary of the temperature of the wafer 6. That is, the fact that the attractive power of the electrostatic chuck electrode 7 on the wafer 6 has fallen to zero, in other words, the potential of the electrostatic chuck electrode 7 and that of the wafer 6 have become equal, can be detected by utilization of the peak temperature of the wafer 6. In more detail, in the case of the present embodiment, the bias voltage by the bias high frequency power source 11 is also applied to the electrostatic chuck electrode 7, so that the wafer potential varies sinusoidally as shown in FIG. 3. It is to be noted here that the output voltage of the variable direct current power source 23 is given as $V_{DC}$, the voltage between the oscillation center of the sinusoidal wave and the earth potential (zero potential). Hence, the voltage $V_{DC}$ corresponding to the peak temperature of the wafer 6 is detected, and can be taken as the wafer potential.

When the potential of the wafer 6 is detected in the above manner, the amount of ions (the amount of current) within the film deposition room 3 can be known. This is because, if the potential of the wafer 6 can be measured, the product of the voltage, which is based on this potential, and the current is the electric power supplied to the power supply antenna 16, and the value of the supplied electric power is known. The amount of ions varies according to plasma conditions whose parameters are the flow rates, pressures, types, etc. of gases forming the plasma. Conventionally, the optimal plasma conditions have been sought by trial and error.

According to the present embodiment, on the other hand, it becomes easy to determine the rational settings of plasma conditions through the intermediary of the amount of ions. Control of the value of the bias voltage by the bias high frequency power source 11 has also heavily relied on experience. By the medium of the wafer potential in the present embodiment, however, control of the value of the bias voltage can also be exercised rationally and easily.

In the wafer potential measuring apparatus in the above-described embodiment, the variable direct current power source 23 is constituted by the use of a direct current power source for an electrostatic chuck attached to a plasma CVD system. Of plasma CVD systems, those without an electrostatic chuck are existent. Even if no electrostatic chuck is provided, the potential of the wafer 6 can be easily detected by adding the temperature detection sensor 21, temperature detection unit 22, variable direct current power source 23, voltmeter 24, wafer potential detection unit 25, and display device 26. It is not necessary, of course, that all of the temperature detection sensor 21 to the display device 26 be provided as in the aforementioned embodiment. What is important is the provision of the feature that the output voltage of the direct current power source corresponding to the peak temperature of the wafer 6 can be detected by a system having temperature detection means for measuring the temperature of the wafer 6, means for electrostatically attracting the wafer 6 to a susceptor, and a variable direct current power source for applying a direct current voltage to the attracting means. Hence, if there is no need to apply a bias voltage to the wafer 6 in the plasma CVD system shown in the aforementioned embodiment, the bias high frequency power source 11, as well as the capacitor and the matching instrument 10, can be omitted. If no bias is applied to the wafer 6, the voltage of the direct current power source corresponding to the peak temperature of the wafer 6 is, unchanged, the wafer potential.

Even when a bias voltage is applied to the wafer 6, namely, even when the system has the bias high frequency power source 11, including the capacitor and the matching instrument 10, the direct current power source for the electrostatic chuck can be omitted. In this case, the bias voltage applied to the electrostatic chuck electrode 7 also functions as a voltage for chucking. In this case, therefore, the bias high frequency power source 11 may be constituted as a variable voltage power source (normally, constituted as a variable voltage power source) and, with the bias voltage being varied, the value of bias voltage corresponding to the peak temperature of the wafer 6 may be detected. The absolute value of the bias voltage at this time is the wafer potential.

Furthermore, FIG. 2 shows the plasma CVD system having the wafer potential measuring apparatus according to the embodiment of the present invention, but the invention need not be limited to a plasma CVD system. The invention can be generally applied to an apparatus in which chucking is performed electrostatically, and the potential of the wafer 6 is detected in a noncontact manner.

Second Embodiment

Figure 4:
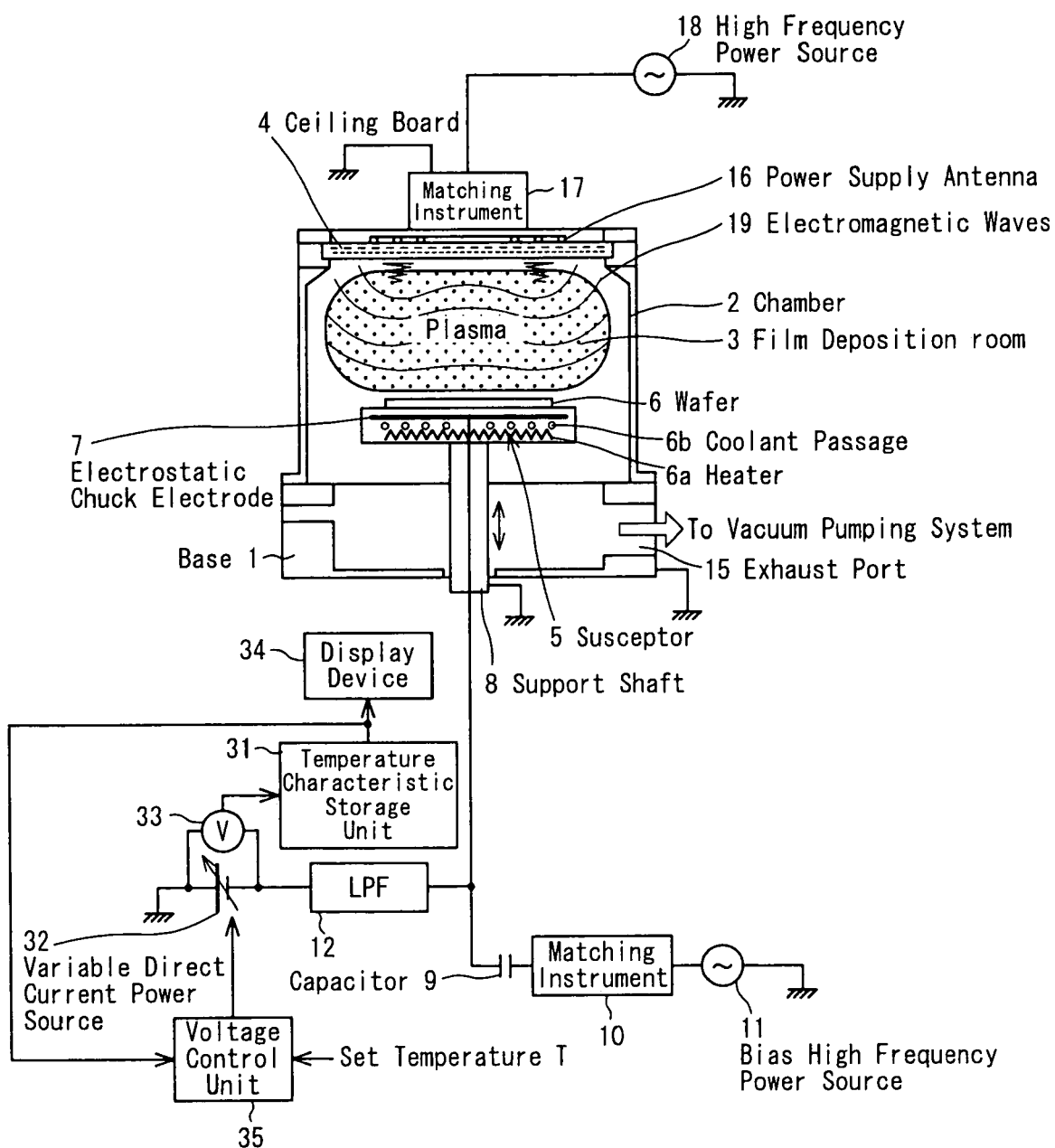
FIG. 4 is a configurational drawing showing a plasma CVD system incorporating a wafer temperature detecting apparatus according to a second embodiment of the present invention.

FIG. 4 is a configurational drawing showing a plasma CVD system incorporating a wafer temperature detecting apparatus according to an embodiment of the present invention. The plasma CVD system shown in the drawing is not essentially different from the plasma CVD system shown in FIG. 7, except that the wafer temperature detecting apparatus is incorporated. In FIG. 4, therefore, the same portions as in FIG. 7 are assigned the same numerals, and duplicate explanations are omitted.

As shown in FIG. 4, the wafer temperature detecting apparatus includes a temperature characteristic storage unit 31 for storing the temperature characteristics of the wafer 6, a variable direct current power source 32 capable of varying in output voltage, a voltage detector 33 for detecting the output voltage of the variable direct current power source 32, a display device 34 for displaying the temperature of the wafer 6, and a voltage control unit 35 for controlling the output voltage of the variable direct current power source 32 such that the temperature of the wafer 6 is a set temperature T.

The temperature characteristics stored in the temperature characteristic storage unit 31 are obtained in the following manner: The wafer 6 placed on the susceptor 5 is attracted toward the susceptor 5 under an electrostatic attractive power generated by the application of the output voltage of the variable direct current power source 32. While the temperature of the wafer 6 is being measured, the output voltage of the variable direct current power source 32 is varied, and the temperature of the wafer 6 in response to each output voltage is detected to obtain temperature characteristics. That is, the temperature characteristic storage unit 31 stores the temperature characteristics shown in FIG. 1. Detection of the temperature of the wafer 6, for obtaining such temperature characteristics, can be performed easily, for example, bypassing a front end portion of an optical fiber through the susceptor 5 to face the back of the wafer 6, obtaining in a noncontact manner an optical signal representing the status of the back of the wafer 6, and guiding the optical signal to an external infrared temperature gauge.

Furthermore, the temperature characteristic storage unit 31 is supplied with a voltage signal, which is the output signal of the voltage detector 33. The temperature characteristic storage unit 31 is adapted to detect the temperature of the wafer 6 corresponding to the value of voltage represented by the voltage signal based on the temperature characteristics of the wafer 6, and is also adapted to supply a temperature signal representing this temperature to the display device 34. As a result, the temperature of the wafer 6 is displayed on the display device 34. The temperature signal, which is the output signal of the temperature characteristic storage unit 31, is also supplied to the voltage control unit 35. At this time, the voltage control unit 35 is supplied with a setting signal representing the set temperature T of the wafer 6. The voltage control unit 35 compares the setting signal and the temperature signal and, based on the deviation between them, controls the output voltage of the variable direct current power source 32 such that the set temperature T is achieved.

Figure 5:
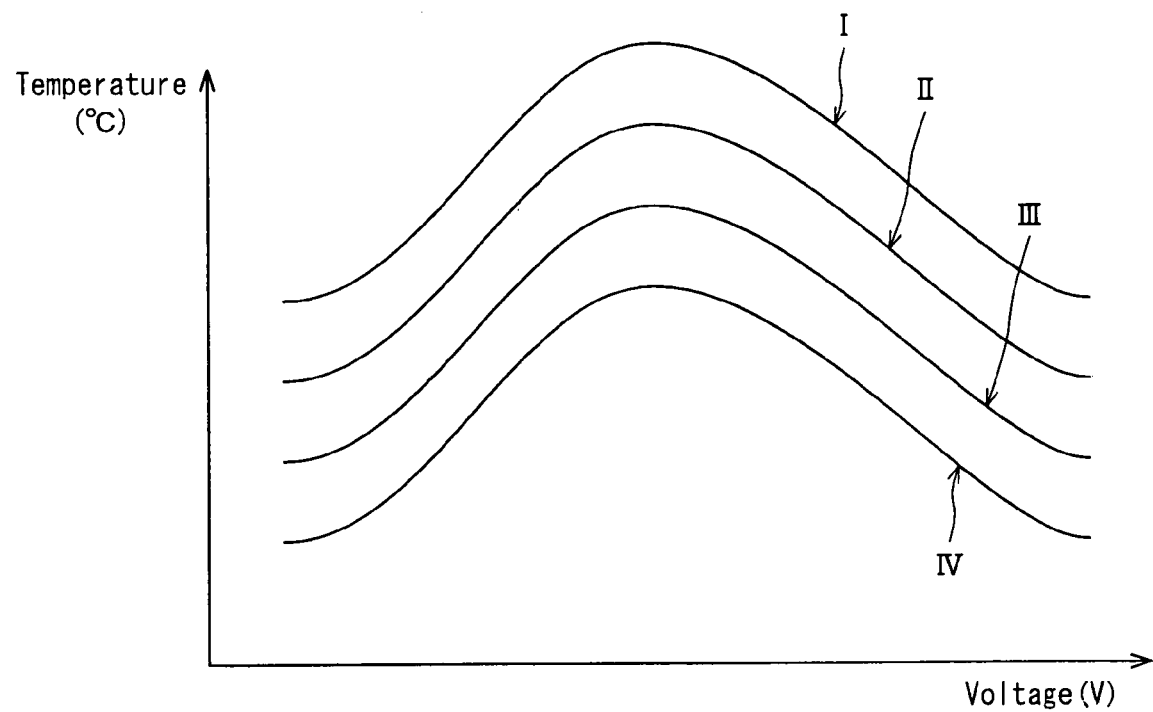
FIG. 5 is a graph showing temperature characteristics stored in a temperature characteristic storage unit of the apparatus shown in FIG. 4.

The temperature characteristic storage unit 31 according to the present embodiment, as shown in FIG. 5, stores a plurality of temperature characteristics I, II, III and IV in different dynamic ranges, which were acquired under different conditions. As shown in FIG. 5, the temperature characteristics change more gently in lower temperature regions, and there is a concern for deteriorated accuracy of the detected temperature in these regions. However, the provision of the plural temperature characteristics I, II, III and IV in different dynamic ranges, as stated above, makes it possible to select and use the temperature characteristics with the most desirable dynamic range within the temperature range of the wafer 6 during operation of the plasma CVD system.

Figure 6:
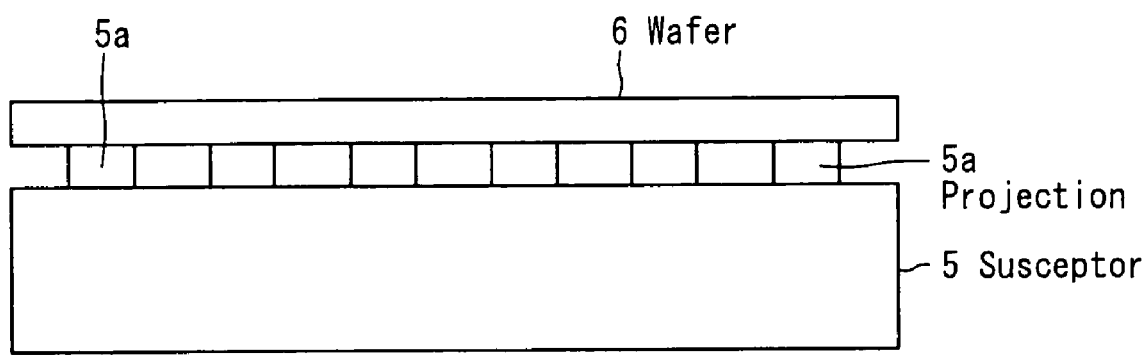
FIG. 6 is an explanation drawing showing an example of a susceptor which is used in obtaining a plurality of temperature characteristics having different dynamic ranges.

To acquire the above temperature characteristics with different dynamic ranges, the following methods can be thought of: For example, as shown in FIG. 6, it is recommendable to prepare a plurality of susceptors 5 constituted such that the surface of the susceptor 5 is embossed to form many projections 5*a*; and a wafer 6 is placed on the susceptor 5 via the projections 5*a*. Under the same plasma conditions, the temperature characteristics of the wafer 6 may be acquired using each of the susceptors 5. At this time, the number or size of the projections 5*a* of the susceptor 5 is changed, whereby the area of contact of the projections 5*a* with the wafer 6 can be changed. The smaller the area of contact, the higher temperature region the dynamic range of the temperature characteristics can belong to. Moreover, the dynamic range can be changed by changing the height of the projections 5*a* of the susceptor 5. In this case, as the height of the projections 5*a* increases, the temperature characteristics having the dynamic range in a higher temperature region can be obtained. Furthermore, a plurality of temperature characteristics can be obtained by using different materials for the susceptor 5. The reason is that resistivity differs according to the material, and even when a constant voltage is applied to the electrostatic chuck electrode 7, the attractive power for attracting the wafer 6 differs, and the efficiency of cooling by the susceptor 5 is not uniform.

In selecting any of the plural dynamic ranges, it is a precondition that the plasma CVD system should be operated under the same conditions, namely, that the same susceptor 5 as the susceptor 5 with which the temperature characteristics were acquired should be used.

According to the present embodiment described above, the temperature of the wafer 6 can be detected through the intermediary of the output voltage of the variable direct current power source 32. That is, the temperature of the wafer 6 can be managed by utilizing the correspondence between the output voltage value of the variable direct current power source 32 and the temperature of the wafer 6. Also, the temperature signal representing the temperature of the wafer 6 at this time is obtained, and feedback control can be exercised using this temperature signal. Thus, plasma processing, such as film deposition, in the plasma CVD system can be ensured, with the wafer 6 being automatically kept at the set temperature. On this occasion, the actual temperature of the wafer 6 may be detectable, for example, by passing a front end portion of an optical fiber through the susceptor 5 to make it face the back of the wafer 6, obtaining in a noncontact manner an optical signal representing the status of the back of the wafer 6, and guiding the optical signal to an external infrared temperature gauge. In this case, the signal representing the measured value of the temperature at this time may be fed back to the voltage control unit 35 to control the temperature of the wafer 6. This latter mode, compared with the former mode, involves a somewhat complicated configuration, but permits more accurate control.

With the wafer temperature detecting apparatus in the above-described embodiment, a plurality of temperature characteristics with different dynamic ranges are stored into the temperature characteristic storage unit 31. However, storage of at least one temperature characteristic is included in the technical ideas of the present invention. Moreover, the formation of the feedback loop utilizing the output voltage of the temperature characteristic storage unit 31 is not essential. Mere detection of the wafer temperature by checking against the direct current voltage in the temperature characteristic storage unit 31 is included in the technical ideas of the present invention.

Equipment, to which the wafer temperature detecting apparatus according to the present embodiment is applied, need not be limited to the system in the above-described embodiment, namely, the plasma CVD system having the bias high frequency power source 11. If, in the plasma CVD system shown in the embodiment, there is no need to apply a bias to the wafer 6, the bias high frequency power source 11, as well as the capacitor 9 and the matching instrument 10, can be omitted. Conversely, the variable direct current power source 32 can be omitted by using a variable RF bias power source as the bias high frequency power source 11. In this case, the variable RF bias power source is used concomitantly as a power source for attraction of the wafer. That is, the temperature characteristics stored in the temperature characteristic storage unit 31 at this time are obtained by detecting the temperature of the wafer 6 in response to each output voltage, while varying the output voltage of the variable RF bias power source.

Furthermore, the system, to which the wafer temperature detecting apparatus according to the present embodiment is applied, is not limited to the plasma CVD system. The wafer temperature detecting apparatus can generally be applied to any system which attracts the wafer 6 to a base plate, such as the susceptor 5, by an electrostatic force and performs predetermined plasma processing of the wafer 6.

As described above, the wafer potential or temperature measuring method and apparatus, and the plasma processing system including the apparatus, according to the present invention, are useful particularly when applied in ensuring the reproducibility of processing, such as film deposition on a wafer, by the plasma processing system, and in exercising temperature control of the wafer.

The invention claimed is:

1. A wafer potential measuring method, comprising:
attracting a wafer, placed on a base stand, toward said base stand by an electrostatic attractive power generated by application of an output voltage of a direct current power source;
varying the output voltage of said direct current power source while measuring a temperature of said wafer in an attracted state;
judging that the electrostatic attractive power to the wafer is zero when the temperature of the wafer peaks; and
detecting the output voltage of said direct current power source at a time when the electrostatic attractive power to the wafer is zero as a potential of said wafer.

2. A wafer potential measuring method, comprising:
attracting a wafer, placed on a base stand, toward said base stand by an electrostatic attractive power of an electrostatic chuck;
varying an output voltage of a direct current power source for said electrostatic chuck while measuring a temperature of said wafer in an attracted state;
judging that the electrostatic attractive power to the wafer is zero when the temperature of the wafer peaks; and
detecting the output voltage of said direct current power source at a time when the electrostatic attractive power to the wafer is zero as a potential of said wafer.

3. A wafer potential measuring method, comprising:
accelerating ions near a wafer, placed on a base stand, by application of an RF bias;
superimposing an output voltage of a direct current power source on said RF bias voltage in an ion-accelerated state;
attracting said wafer, placed on said base stand, toward said base stand by an electrostatic attractive power generated by application of the output voltage of said direct current power source;
varying the output voltage of said direct current power source while measuring a temperature of said wafer in an attracted state;
judging that the electrostatic attractive power to the wafer is zero when the temperature of the wafer peaks; and
detecting the output voltage of said direct current power source at a time when the electrostatic attractive power to said wafer is zero as a potential of said wafer.

* * * * *